United States Patent [19]
Hodge et al.

[11] Patent Number: 5,448,165
[45] Date of Patent: Sep. 5, 1995

[54] ELECTRICALLY TESTED AND BURNED-IN SEMICONDUCTOR DIE AND METHOD FOR PRODUCING SAME

[75] Inventors: Robin H. Hodge, Portola Valley; Thomas H. Templeton, Jr., Fremont, both of Calif.

[73] Assignee: Integrated Device Technology, Inc., Santa Clara, Calif.

[21] Appl. No.: 1,884

[22] Filed: Jan. 8, 1993

[51] Int. Cl.[6] .......................................... G01R 31/00
[52] U.S. Cl. ................................ 324/158.1; 324/765
[58] Field of Search ............... 324/158 F, 158 P, 72.5, 324/158 R, 765, 766, 158.1; 29/574, 827; 437/217, 8, 219; 257/48, 40

[56] References Cited

U.S. PATENT DOCUMENTS

| | | | |
|---|---|---|---|
| 3,583,561 | 6/1971 | Wiesler et al. | 324/158 D |
| 4,351,108 | 9/1982 | Johnson | 324/158 F |
| 4,866,508 | 9/1989 | Eichelberger et al. | 324/158 T |
| 4,985,988 | 1/1991 | Littlebury | 324/158 R |
| 5,120,665 | 6/1992 | Tsukagoshi et al. | 437/8 |
| 5,149,662 | 9/1992 | Eichelberger | 437/8 |
| 5,173,451 | 12/1992 | Kinsman et al. | 437/209 |

OTHER PUBLICATIONS

Gene Cloud, et al., "Known–Good Die: A Key to Cost–Effective MCMs," Electronic Packaging & Production, Sep. 1992, pp. 50–51.

*Primary Examiner*—Vinh P. Nguyen
*Attorney, Agent, or Firm*—Skjerven, Morrill, MacPherson, Franklin & Friel; Alan H. MacPherson

[57] ABSTRACT

A semiconductor die is temporarily enclosed in a package. The packaged die is then electrically tested and burned in. The tested die is then removed from the package. If the die performed acceptably during test and burn-in, the die is retained and either used in a production integrated circuit or sold as an unpackaged individual die. The method is simple, inexpensive, and provides semiconductor dice of high reliability (packaged die yields approach 100%). Existing test and production facilities, equipment and process flows may be used with, at most, minor changes to process a semiconductor die for any application. Semiconductor dice processed by the method are particularly useful for complex and/or costly packaging options, e.g., multi-chip modules, hybrid circuits or chip-on-board.

19 Claims, 4 Drawing Sheets

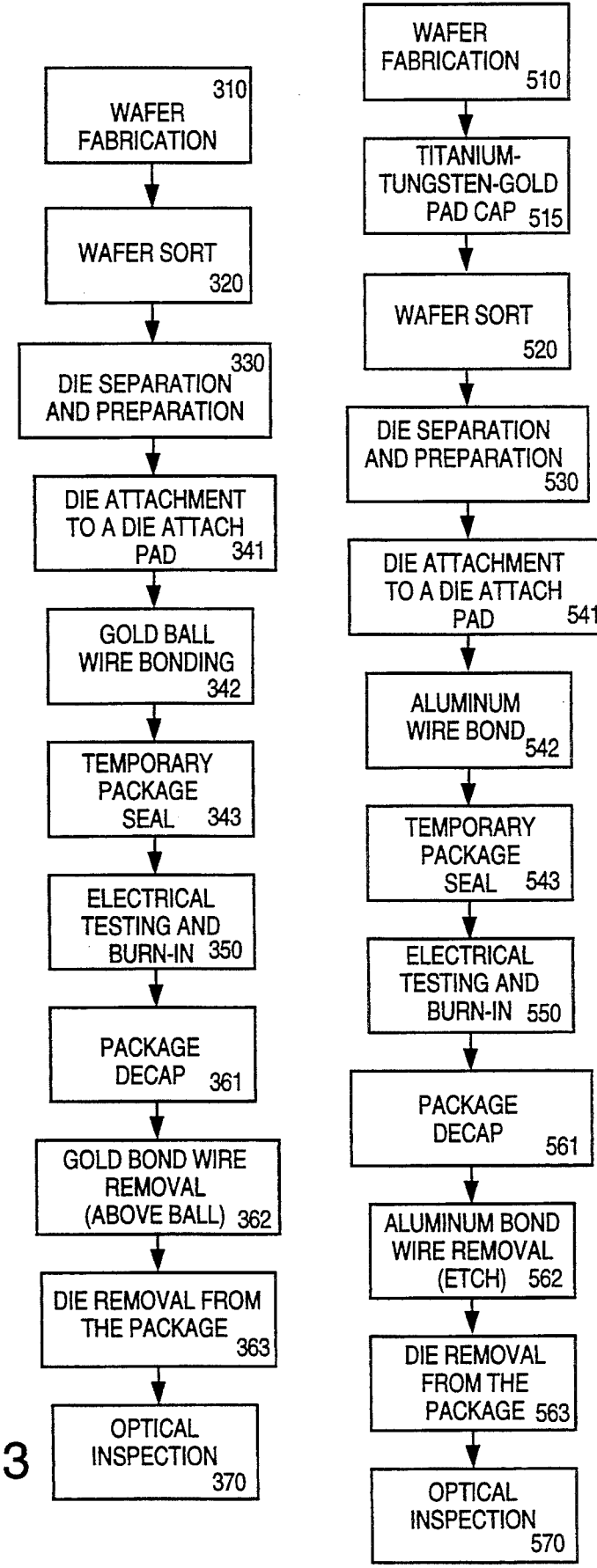

ELECTRICALLY TESTED AND BURNED-IN SEMICONDUCTOR DIE AND METHOD FOR PRODUCING SAME

BACKGROUND OF THE INVENTION

1. Field of the Invention

This invention relates to integrated circuits and, in particular, to die level electrical testing and burn-in of a semiconductor die on which electrically conductive circuitry is formed.

2. Related Art

FIG. 1 is a flow chart of a standard method for producing packaged integrated circuits. Wafer fabrication 110, wafer sort 120, and die separation and preparation 130 produce individual integrated circuit chips (semiconductor dice on which integrated circuitry is formed). Each individual chip is then enclosed in a protective covering during assembly into an integrated circuit package 140. During post-packaging integrated circuit testing 150, the packaged integrated circuit chips are subjected to electrical testing and burn-in to verify acceptable operation of the integrated circuit chips.

Since not all integrated circuit chips prove to operate acceptably after being packaged, a certain number of packaged integrated circuits must be either reworked (i.e., bad chips replaced with new chips that are then electrically tested and burned in) before use or discarded. This unreliability of chip operation adds to the expense of producing packaged integrated circuits. The additional cost is even greater for high cost or high complexity packaged integrated circuits such as hybrid circuits, chip-on-board, or multichip modules.

The electronics industry continually demands components with faster response times than existing components. Multichip integrated circuits (i.e., a plurality of integrated circuit chips formed in a single package) are increasingly desirable as a means to meet this need for faster performance since the chips can be located closer together in the package than is possible when each chip is packaged in a separate package. The single biggest obstacle to increased use of multichip integrated circuits is the high level of failure of packaged multichip integrated circuits, relative to single chip integrated circuits, during the testing and burn-in phase of production.

The high percentage of multichip integrated circuits that fail during post-packaging testing is a statistical consequence of the combination in one package of a relatively large number of chips characterized by a chip yield significantly below 100%. Here, chip yield is defined as the probability that any given chip will operate acceptably during post-packaging integrated circuit testing 150. For instance, assuming a chip yield of 95%, the probability that an eight chip package will operate acceptably during post-packaging integrated circuit testing 150 is 66%. In practice, a chip yield of 95% is high. For the more common situation in which the chip yield is lower than 95%, the acceptability rate of the eight chip package rapidly decreases. Further, as the number of chips in a package increases, the acceptability rate also rapidly decreases.

The high failure level of packaged multichip integrated circuits makes production of packaged multichip integrated circuits expensive. In order to avoid discarding packaged multichip integrated circuits that fail post-packaging testing, redundant sets of bond pads are built on the substrate of the multichip integrated circuit for each chip location. If bad chips are identified during the testing of the packaged multichip integrated circuit, the bad chips are removed and replaced with new chips which are attached to an unused set of bond pads. The process is repeated until the packaged multichip integrated circuit performs acceptably.

This process requires re-opening the package to replace the bad chip or chips, re-sealing the package, and retesting the packaged multichip integrated circuit with the new chip or chips, thus increasing the time and cost of producing a packaged multichip integrated circuit. This process also necessitates that the package be made slightly larger than would otherwise be necessary to accommodate the additional sets of bond pads needed to accommodate any required new chips. Further, in order to know which chip or chips of a packaged multichip integrated circuit has failed, the multichip integrated circuit may allow testing the operation of individual chips, increasing the complexity (and thus cost) of the multichip integrated circuit design. Alternatively, if individual chips can not be tested, then, when failure of a chip in a packaged multichip integrated circuit occurs, each chip of the packaged multichip integrated circuit must be replaced, one at a time, and the packaged multichip integrated circuit retested until the failed chip is located. It would be expected that identification of a bad chip in this way would typically take several iterations of chip replacement and retesting, making production of a packaged multichip integrated circuit correspondingly more expensive. If more than one chip is bad, even more reworking of the packaged multichip integrated circuit is required. Finally, the retesting that is necessary when a bad chip must be replaced uses up some of the useful life of the good chips within the package, thus shortening the life of the multichip integrated circuit.

In an attempt to increase the reliability of integrated circuit chips before they are committed to a production integrated circuit package, methods have been developed to perform a wafer level electrical test and burn-in. However, these methods are extremely complex and, in any case, they are only partial solutions to the problem of producing more reliable chips since there are limits on how severely the chips can be stressed, how well they can be clocked and whether they can be characterized for speed at the wafer level.

Tape automated bonding (TAB) allows chips to be electrically tested and burned in prior to being committed to a particular package; however, TAB is expensive and may only be used for a limited number of package types. Further, TAB requires more space for the chips in the package. Additionally, since the chips are typically left on the TAB tape after testing, the outer lead bond must be broken if the chips are to be used in a package other than the one in which they were tested. Breaking of the outer lead bond is difficult to do, making use of TAB as a testing and burn-in method troublesome.

A chip carrier has also been used to electrically test and burn in integrated circuit chips. The die is mounted in the cavity of a chip carrier and covered with a lid. Conductive traces are formed on the interior surface of the lid. The lid is aligned with the die and pressure applied to the lid such that one end of each of the traces contacts a bond pad on the die. The other end of each of the traces is used to make connection to test circuitry outside the chip carrier. While the lid is held pressed against the die, the die is electrically tested and burned in. After test and burn-in, the die is removed from the carrier and, if the die performed acceptably during test and burn-in, the die is used in a production integrated circuit package or shipped as a tested good die.

This method requires a specially designed carrier and lid for each type of integrated circuit chip so that for each type of chip tested, a new lid and possibly carrier must be used. Consequently, the method is expensive, particularly when used for testing small lots of chips.

Existing methods of testing and burning in integrated circuit chips at the die level provide only partial test and burn-in or require complex and/or expensive techniques. Thus, there is a need for a simple and inexpensive method of fully testing and burning in integrated circuit chips at the die level.

SUMMARY OF THE INVENTION

According to the invention, a method for electrically testing and burning in a semiconductor die, a semiconductor die electrically tested and burned in by the method, and integrated circuit packages containing one or more semiconductor die electrically tested and burned in by the method are provided. In a method in accordance with the invention, a semiconductor die is temporarily enclosed in a package such that electrical connection is made to the semiconductor die from outside the package. The electrical connection allows one or more electrical signals to be sent to the semiconductor die. The electrical signals are used to test the packaged semiconductor die to ascertain acceptable operation. Once the semiconductor die is tested, the semiconductor die is removed from the package. If the operation of the semiconductor die was not acceptable, the die is discarded. If the operation of the semiconductor die was acceptable, the die is retained and, if it passes an optical inspection, is either permanently encased in a package or sold as an unpackaged individual die.

The testing of the semiconductor die inside the package typically comprises a first series of electrical tests, burn-in of the semiconductor die, and a second series of electrical tests. The electrical tests may comprise, for instance, a set of tests to verify that the semiconductor die meets certain speed specifications, a set of tests to verify that the semiconductor die meets certain voltage, capacitance and current specifications, and a set of tests to verify that the semiconductor die properly performs the function for which it was designed (e.g., a die on which logic circuitry is formed must properly execute the desired logical function). The burn-in of the semiconductor die comprises elevating the ambient temperature surrounding the package (and thus the temperature of the semiconductor die) while an electrical load is applied to the semiconductor die.

The method in accordance with the invention is simple, inexpensive, and provides a semiconductor die of high reliability. Existing test and production facilities, equipment and process flows may be used with, at most, minor changes. The same temporary package may be used a plurality of times to electrically test and burn in semiconductor dice according to the invention. Die yields (i.e., the probability that any given die will operate acceptably during post-packaging testing after being encased in a permanent package) for dice processed according to the invention are nearly 100%.

The method in accordance with the invention may be used to process a semiconductor die for any application. The method is particularly desirable for producing complex integrated circuit chips (e.g., memory chips, microprocessor chips), where failure of the packaged chip during burn-in is most likely. A semiconductor die processed according to the invention may be used for any assembly option, and semiconductor dice processed according to the invention are particularly useful for multichip modules, hybrid circuits, chip-on-board or other high cost or high complexity packages since the high reliability of the die virtually eliminates rework of the packaged die.

BRIEF DESCRIPTION OF THE DRAWINGS

FIG. 3 is a flow chart of another embodiment of the method according to the invention for electrically testing and burning in an integrated circuit chip.

FIG. 5 is a flow chart of another embodiment of the method according to the invention for electrically testing and burning in an integrated circuit chip.

DETAILED DESCRIPTION OF THE PREFERRED EMBODIMENTS

Figures 1, 2:
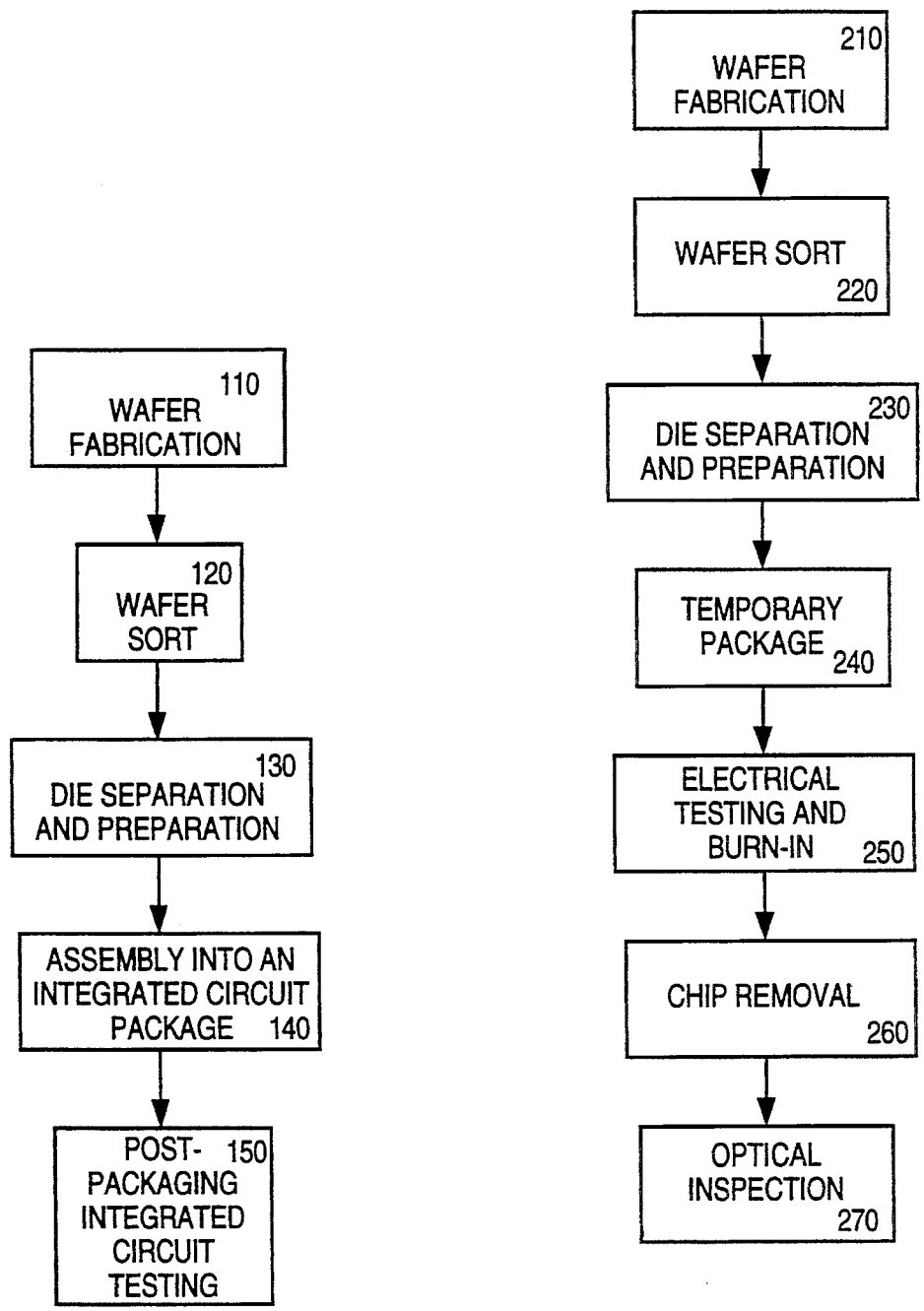
FIG. 1 is a flow chart of a prior art method for producing packaged integrated circuits.
FIG. 2 is a flow chart of one embodiment of the method according to the invention for electrically testing and burning in an integrated circuit chip.

According to the invention, a semiconductor die is electrically tested and burned in before being permanently packaged. FIG. 2 shows an embodiment of the method according to the invention for electrically testing and burning in an integrated circuit chip (a semiconductor die on which integrated circuitry is formed). According to the method, after wafer fabrication 210, wafer sort 220, and die separation and preparation 230, the integrated circuit chip is sealed in a temporary package 240. The packaged chip is subjected to electrical testing and burn-in 250. The package is then reopened to allow chip removal 260. If a chip did not perform acceptably during electrical testing and burn-in 250, it is discarded. If the chip did perform acceptably, it is subjected to an optical inspection 270. If no defects are detected during the optical inspection 270, then the chip is ready for packaging in a permanent integrated circuit package or for sale as an individual unpackaged integrated circuit chip.

The method according to the invention yields integrated circuit chips that are fully tested and burned-in. Chip yields (i.e., the probability that any given chip will operate acceptably during post-packaging testing after being encased in a permanent package) are very nearly 100%. Existing test and production facilities, equipment and process flows may be used with only minor changes so that the method of the invention is inexpensive (in equipment and implementation) and reliable. The chips processed in accordance with this invention may be used for any assembly option, e.g., multichip integrated circuit, chip-on-board, hybrid circuit. The invention may be used to process integrated circuit chips for any application; however, the invention is particularly desirable for increasing the reliability of complex (and thus expensive) integrated circuit chips (e.g., memory chips, microprocessor chips).

FIG. 3 shows another embodiment of the method according to the invention for electrically testing and burning in an integrated circuit chip. During wafer fabrication 310, a plurality of die, each die containing electrically conductive circuitry and bond pads, are formed on a wafer of semiconductor material. After wafer fabrication 310, a pad cap 315 is applied which covers each bond pad with additional glassivation and metal layers.

The pad cap 315 is applied in a process similar to the well-known TAB bump process. The pad cap 315 may comprise, for instance, a first layer of titanium/tungsten alloy over the pad and a second layer of gold over the titanium/tungsten alloy. The titanium/tungsten layer can be formed by, for instance, sputtering and is typically approximately 3000 angstroms thick. The gold layer can also be formed by, for instance, sputtering and is typically approximately 1000 angstroms thick. Typically, a gold layer of approximately 25 microns in thickness is then applied by plating.

The titanium/tungsten and gold layers prevent the formation of undesirable intermetallics during the burn-in step described below. It is to be understood that, if desired, rather than layers of titanium/tungsten and gold, equivalent metal barrier layers (e.g., nickel, chromium) could be used.

Each die is then electrically tested for electrical performance and circuit functioning during wafer sort 320, and bad dice (i.e., semiconductor dice that did not perform acceptably) are marked. During die separation and preparation 330, the dice on the wafer are separated, bad dice are discarded, and die preparation of the good dice performed as needed. Also at this time, the good dice are optically inspected with a microscope to identify any mechanical damage such as cracks or breaks, or other observable defects such as discoloration representing unacceptable dielectric thicknesses.

According to the standard method for producing integrated circuits shown in FIG. 1, at this point, each good die is permanently encased inside an integrated circuit package and the integrated circuit package is then electrically tested and burned in. If the die performs acceptably, then the integrated circuit containing the die is ready for use in an electronic product; if not, the integrated circuit is reworked (i.e., the package is opened, the bad die is replaced with a new die, the package is resealed and the new die is tested) or discarded.

According to the invention, however, rather than permanently encasing the die in an integrated circuit package, the die is inserted into a temporary "test" integrated circuit package. Die attachment to a die attach pad 341 is performed in any manner that allows later removal of the die without damaging either the die or the package. Illustratively, the die can be attached to the die attach pad with a thermoplastic adhesive, e.g., STASTICK TM-181. The adhesive is placed on the die attach pad and subjected to heat. As the adhesive warms, it becomes tacky. When the adhesive is sufficiently tacky, the die is placed on the adhesive. The adhesive is then allowed to cool and harden, attaching the die to the die attach pad.

The test package for use with the invention is a cavity type package. Any cavity package may be used; however, preferably the package is highly durable, requires only standard equipment and processes for assembly and testing, and is reusable. In one embodiment of the invention, a standard side-brazed, dual in-line, co-fired ceramic package is used. The test package according to the invention does not impose any limitations on the types of semiconductor dice that can be electrically tested and burned in according to the invention; according to the invention, any semiconductor die may be electrically tested and burned in.

After die attachment to a die attach pad 341, the capped bond pads on the die are electrically connected to an inner portion of selected ones of a plurality of leads of the test package by reverse gold ball wire bonding 342. Gold bonding wire is fed from a capillary. An electrical spark or combustible gas (e.g., hydrogen) melts the tip of the wire, forming a ball. The capillary moves downward, forcing the melted wire onto an inner portion of a lead to form a ball bond. The bond may be formed by thermo-compression (a combination of force applied by the capillary and heat form the bond) or the bond may be formed thermosonically (ultrasonic energy is added to a combination of force from the capillary and heat to form the bond). After attachment of the ball bond on the inner portion of the lead, the capillary moves toward a selected one of the capped bond pads, feeding bond wire as it travels. The wire is forced onto the pad cap 315 where it forms, either thermosonically or by thermo-compression, a "crescent" or "stitch" bond on the capped bond pad. The wire is mechanically severed from the tip of the crescent bond and a spark or flame is used to form a ball on the end of the severed wire. The process is repeated continuously from lead to bond pad to lead until bonding is complete.

In contrast to typical bonding processes in which the crescent bond is made as robust as possible so that the bond wire will stay bonded to the pad, in the reverse gold ball wire bonding 342, the crescent bond is made so that it can be broken relatively easily so that, as explained below, the die can be removed from the test package for later use in a production integrated circuit package without damaging the die. The crescent bond can be made easier to break by changing the characteristics of the capillary (i.e., hole size, face angle, face diameter, inner radius, outer radius) or by changing certain process parameters (bonding pressure, bonding time, magnitude of power supplied).

Figure 4A:
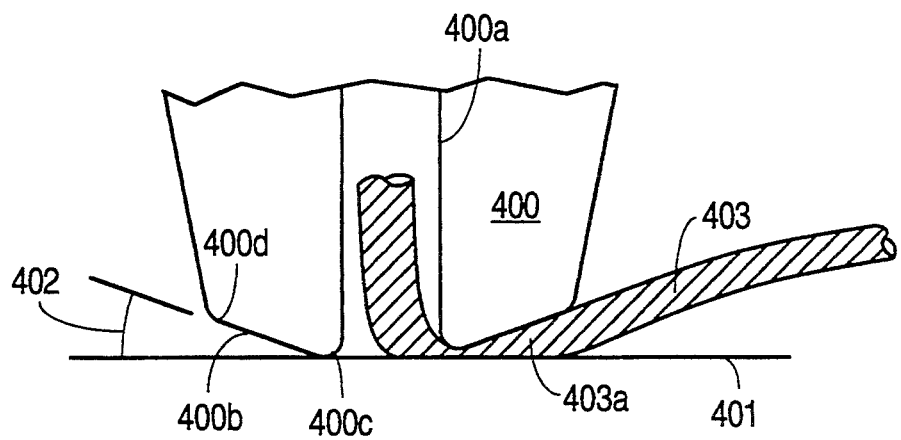
FIG. 4A is a cross-sectional view of a conventional gold wire capillary held in position to form a crescent bond on a surface.

FIG. 4A is a cross-sectional view of a conventional gold wire capillary 400 held in position to form a crescent bond on a surface 401 (e.g., lead or bond pad). A hole 400a is formed in the capillary 400 out of which gold bond wire 403 extends. The capillary face 400b is at an angle 402 (face angle) with respect to the surface 401. The edges of the face 400b are rounded to have an inside radius 400c and outside radius 400d. When the capillary 400 forces the bond wire 403 onto the surface 401, the angled face 400b of the capillary 400 shapes the bond wire 403 between the face 400b and surface 401 into a wedge-shaped section 403a. After the bond wire 403 is severed, the wedge-shaped section 403a remains.

Figure 4B:
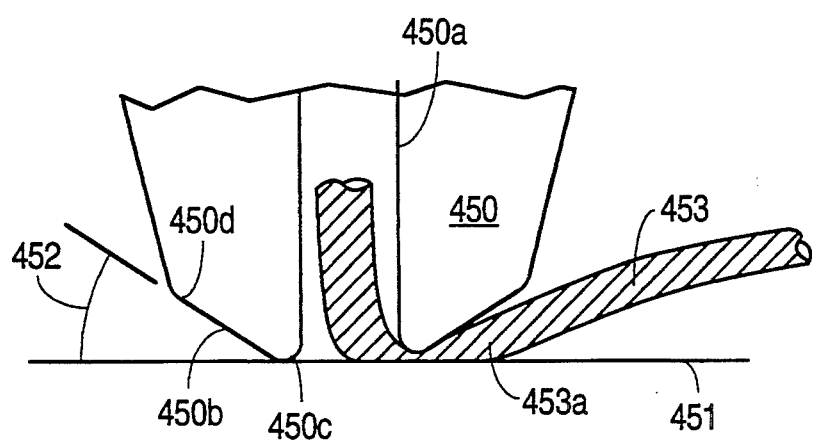
FIG. 4B is a cross-sectional view of a gold wire capillary, modified in accordance with the invention, held in position to form a crescent bond on a surface.

FIG. 4B is a cross-sectional view of a gold wire capillary 450 held in position to form a crescent bond on a surface 451 (e.g., lead or bond pad). The capillary 450 is modified, as compared to the capillary 400, to form a crescent bond that may more easily be broken. The face angle 452 between the face 450b and surface 451 is greater than the face angle 402 of capillary 400, the diameter of face 450b is smaller than the diameter of face 400b of capillary 400, the inner radius 450c is smaller than the inner radius 400c of capillary 400, and the outer radius 450d is larger than the outer radius 400d of capillary 400. Additionally, the diameter of the hole 450a could be made larger than shown (for a constant diameter of the capillary face 450b) to further weaken the crescent bond formed by the capillary 450. As a consequence of these changes, the capillary 450 forms a smaller wedge-shaped section 453a between the face 450b and surface 451 than the wedge-shaped section 403a formed by capillary 400. After the bond wire 453 is severed, only the wedge-shaped section 453a remains on the surface 451. In breaking the bond wire 453 from the surface 451 (as occurs during gold bond wire removal 362 as explained later), it is relatively easy to break the bond wire 453 at the location of the small wedge-shaped section 453a as compared to the larger wedge-shaped section 403a formed by conventional capillary 400 of FIG. 4A.

As noted above, certain process parameters can also be changed in order to weaken the crescent bond. For instance increasing the bonding pressure, decreasing the bonding time, or increasing the magnitude of power supplied during bond formation would each likely weaken the crescent bond.

Rather than reverse gold ball wire bonding, gold ball wire bonding could be used to electrically connect the capped bond pads on the die to an inner portion of the leads. Gold ball wire bonding is similar to reverse gold ball wire bonding. In gold ball wire bonding, rather than first forming ball bond on the lead and then forming a crescent bond on the pad, a gold ball bond is first formed on the pad and then a crescent bond is formed on the lead.

After reverse gold ball wire bonding 342, a temporary package seal 343 closes off the die from the external environment. The package seal can be accomplished by attaching a lid over the package cavity. In one embodiment of the invention, the lid is attached with an epoxy adhesive. Other adhesives such as thermoplastic adhesive may be used. The lid may also be soldered or taped to the package, snapped into place, or clipped to the package. More generally, the invention encompasses any technique for sealing the die inside the package that allows the package to be reopened such that the die is not damaged. Preferably, the package is also not damaged so that the package is reusable.

After the temporary package seal 343, the temporarily packaged die is subjected to electrical testing and burn-in 350. The electrical tests comprise speed grading, parametric tests that ensure that the die meets certain voltage, capacitance and current specifications, and functional tests that verify the die's ability to perform the die's designated function (e.g., for memory chips, data storage and retrieval capability). If the die performs acceptably during the electrical tests, the packaged die is then mounted on a burn-in board and burned in, i.e., the die is held at an elevated temperature while under an electrical load. After burn-in, the die undergoes electrical tests again. At the conclusion of electrical testing and burn-in 350, good dice (i.e., those that performed acceptably) and bad dice (i.e., those that performed unacceptably) are noted and segregated.

After electrical testing and burn-in 350, package decap 361 exposes the die so that it may be removed from the test package. For instance, if the temporary package seal 343 was a lid attached over the package cavity with a thermoplastic adhesive, package decap 361 is accomplished by melting the adhesive until it is soft, and then removing the lid. Likewise, where the lid is soldered over the cavity, the solder is melted and the lid removed.

When the die is exposed, gold bond wire removal 362 breaks the connection of the die to the package leads. The gold bond wire is mechanically removed by, for instance, tearing or cutting so as to leave a minimal amount of gold wire residue (ideally, none) on top of the capped bond pad. If the bond wire is torn from the capped bond pad, the break occurs at the heel of the bond where the wire leaves the foot of the bond over the bond pad. Thus, the pad cap 315 is left formed above the bond pad and the bond pad is undamaged by the removal of the bond wire (excepting a few statistical aberrations) so that bonding to the bond pad may be accomplished when the die is included in a production integrated circuit package. Further, as is well known, the presence of gold wire residue causes little or no problem in subsequent TAB or gold ball bonding to the die. This later bonding may be readily accomplished by bonding to the pad cap 315 using any of a variety of wirebonding processes. The quality of the bond is not detrimentally affected by gold wire residue left on the pad cap 315. The pad cap 315 also enhances the reliability of the die by providing a barrier to corrosive ions and moisture that might otherwise attack the bond pad.

Once the bond wires have been removed, die removal from the package 363 is accomplished. Where, for instance, the die has been attached with a thermoplastic adhesive, the die is removed by subjecting the package to heat to cause the adhesive to soften, then removing the die from the die attach pad. The die is cleaned using an appropriate solvent, e.g., acetone, to remove adhesive residue and rinsed with deionized water. The die is then subjected to an optical inspection 370 with a microscope to detect the presence of mechanical damage. If the die performed acceptably during electrical testing and burn-in 350, and passes the optical inspection, the die is ready either for use in a production integrated circuit or for sale as an unpackaged die.

FIG. 5 shows another embodiment of the method according to the invention for electrically testing and burning in an integrated circuit chip. As in the method of FIG. 3, during wafer fabrication 510, a plurality of dice, each die comprising electrically conductive circuitry and bond pads, are formed on a wafer of semiconductor material.

After wafer fabrication 510, a pad cap 515 is applied to each of the bond pads of each of the dice. The cap can be applied, for example, in a manner similar to the TAB bump process. Typically, the pad cap 515 is formed by successive layers of material. For instance, the pad cap 515 could comprise successive layers of titanium/tungsten and gold, successive layers of titanium/tungsten, gold, nickel and silver, or successive layers of titanium/tungsten, gold, nickel and aluminum. In either combination, the titanium/tungsten and gold layers are formed as described above with respect to FIG. 3. The nickel and silver layers are each added by plating. The aluminum layer (if applicable) is added by sputtering. Each of the nickel, silver and aluminum layers typically has a thickness of approximately 1 micron.

As will be explained later, it is necessary that the materials used for the pad cap 515 protect the bond pads from etchant used to remove bond wires after electrical test and burn-in of the die. Further, the composition of the pad cap 515 is chosen so as to inhibit the production of intermetallic compositions (such as may form during burn-in) from the metals of the bond pad, pad cap 515, and bonding wire (used, as explained below, to make connection from the die to electrical components outside package material encapsulating the die) that can inhibit bonding to the pad cap 515 when the die is later used in a production integrated circuit package. Additionally, as in the method described with respect to FIG. 3 above, the pad cap 515 also enhances the reliability of the die by providing a barrier to corrosive ions and moisture that might otherwise attack the bond pad.

After application of pad cap 515, wafer sort 520, die separation and preparation 530, and die attachment to a die attach pad 541 are performed, as described previously with respect to FIG. 3.

After die attachment to the die attach pad 541, the bond pads on the die are electrically connected to an inner portion of selected ones of the leads of the test package by aluminum wire bonding 542. Aluminum bonding wire is fed from a bonding tool (wedge) and positioned over a bonding pad. As the wedge forces the wire onto the pad, a pulse of ultrasonic energy sent through the wedge forms a bond. After bond formation, more wire is fed from the wedge as the wedge moves to an inner portion of a lead. The wedge and ultrasonic energy are used to form another bond at the inner portion of the lead. The aluminum wire is then cut. Either the package or the wedge is then repositioned to allow formation of the next bond. The process is repeated until all bonds are formed. Alternatively, the bonding could be done by first forming a bond between the bond wire and the lead and then forming a bond between the bond wire and the bond pad.

After aluminum wire bonding 542, the die is enclosed in the test package by a temporary package seal 543, subjected to electrical testing and burn-in 550, then exposed again by package decap 561, as described previously with respect to FIG. 3.

Aluminum bond wire removal 562 breaks the connection between the die and package leads. Aluminum bond wire removal 562 is accomplished by subjecting the package to an acid etchant that removes at least the aluminum bond wires.

When the pad cap 515 comprises successive layers of titanium/tungsten and gold, the etchant is, for instance, a 50% solution of hydrochloric acid applied, for instance, approximately 3 minutes. The hydrochloric acid etches away the aluminum bond wire from the pad cap 515.

When the pad cap 515 comprises successive layers of titanium/tungsten, gold, nickel and silver, or successive layers of titanium/tungsten, gold, nickel and aluminum, the etchant may be, for instance, a solution of nitric acid. The nitric acid etches away the nickel, silver and aluminum so that the aluminum bond wire is "floated" off of the remainder of the pad cap 515.

The pad cap 515 protects the bond pad and prevents the bond pad from being removed by the etchant. The remainder of the die is protected from the etchant by the glassivation layers applied to the die during wafer fabrication and the pad cap process. The package is protected from the etchant by gold plating that is applied to the package before electrically testing and burning in a die according to the invention.

In a typical integrated circuit using aluminum wire bonding, the aluminum bond wire is bonded directly to an aluminum bond pad. However, in the method according to the invention, the aluminum bond pads are capped and the aluminum bond wire bonded to the cap so that the bond wire can be removed from the die without damaging the pad. Thus, the capping enables the die to be re-used later in a production integrated circuit, a result that would not be possible using the conventional aluminum wire bonding technique without the pad cap. In later use of the die, electrical connection to the die may be made by a variety of wire-bonding methods including gold ball bonding, reverse gold ball bonding, or aluminum wire bonding.

Though this embodiment of the invention is described above with specific examples of the composition of the pad cap 515 and specific examples of the composition of the etchant, it is to be understood that other materials could be used for both the pad cap and etchant. The choice of materials is restricted by the conditions that the etchant be capable of etching away the aluminum bond wire and not be capable of completely etching away the material chosen for the pad cap 515.

Once the bond wires have been removed, die removal from the package 563 and optical inspection 570 are performed, as described previously with respect to FIG. 3. Good dice are ready for use individually or in production integrated circuits.

Figure 6:
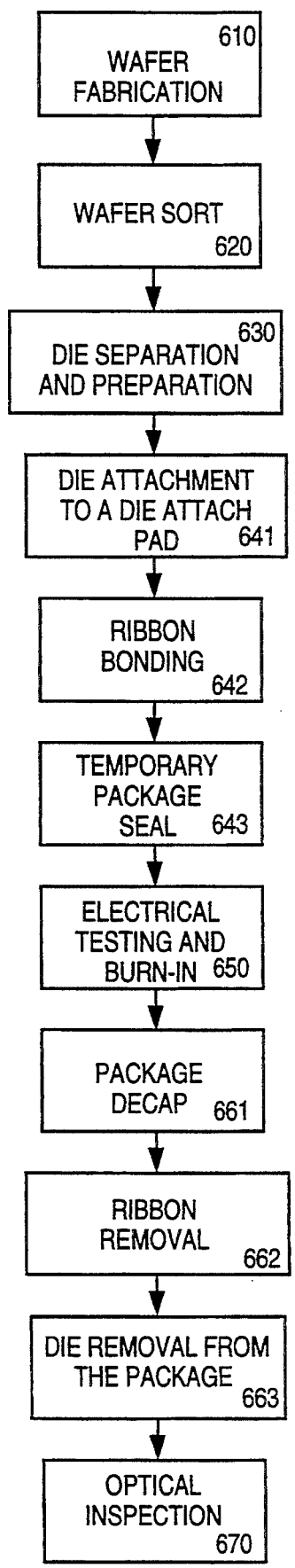
FIG. 6 is a flow chart of another embodiment of the method according to the invention for electrically testing and burning in an integrated circuit chip.

FIG. 6 shows another embodiment of the method according to the invention for electrically testing and burning in an integrated circuit chip. Wafer fabrication 610, wafer sort 620, die separation and preparation 630, and die attachment to a die attach pad 641 are performed as described previously with respect to FIGS. 3 and 5. Unlike the embodiments of the method according to the invention of FIGS. 3 and 5, no pad cap is formed after wafer fabrication 610 and before wafer sort 620.

After die attachment to a die attach pad 641, the bond pads on the die are electrically connected to an inner portion of selected ones of the leads of the test package by ribbon bonding 642. Either aluminum or gold ribbon (i.e., flat bond wire), the ribbon having a width (e.g., 2-3 mils) that is approximately equal to the bond pad width and substantially larger than the ribbon thickness (e.g., 0.25-0.50 mils), is fed through a wedge and positioned over a bonding pad. The wedge forces the wire onto the bonding pad. When aluminum bond wire is used, a pulse of ultrasonic energy sent through the wedge forms a bond. When gold bond wire is used, the bond is formed using either thermosonic or thermocompression bonding techniques. After bond formation, more ribbon is fed from the wedge as the wedge moves to an inner portion of a lead. The wedge is used to form another bond at the inner portion of the lead using ultrasonic, thermosonic or thermo-compression bonding, as appropriate. The ribbon is then cut. Either the package or the wedge is then repositioned to allow formation of the next bond. The process is repeated until all bonds are formed. Alternatively, the bonding could be done by first forming a bond between the ribbon and the lead and then forming a bond between the ribbon and the bond pad.

After ribbon bonding 642, the die is enclosed in the test package by a temporary package seal 643, subjected to electrical testing and burn-in 650, then exposed again by package decap 661, as described previously with respect to FIGS. 3 and 5.

Ribbon removal 662 breaks the connection between the die and package leads. The ribbon is mechanically removed by, for instance, tearing or cutting so as to leave the ribbon material above the bond pad intact. If the ribbon is torn, the break occurs at the heel of the ribbon bond in a manner similar to that described above with respect to the gold bond wire removal 362 of FIG. 3. The ribbon material over the bond pad will usually not be torn away so that the bond pad remains undamaged. Since the bond pad is undamaged, when used in a production integrated circuit package, bonding to die processed according to the method described above may be readily accomplished by bonding to the ribbon material over the bond pad using any of a variety of wirebonding processes.

After ribbon removal 662, die removal from the package 663 and optical inspection 670 are performed, as described previously with respect to FIGS. 3 and 5. Good dice are ready for use individually or in production integrated circuits.

The method according to the invention allows a semiconductor die to be fully electrically tested and burned in. Consequently, integrated circuits including only such dice will almost certainly perform acceptably during post-packaging testing. Further, since integrated circuit chip failure typically occurs early in the life of a chip, the field performance of integrated circuits including chips processed according to the invention will be very good (i.e., the incidence of chip failure after the integrated circuit has been commercially sold will be low). Typically, depending on the type of circuit device, FIT (Failure in Time) levels, i.e., number of device failures per billion hours of use, range from 10 (logic devices) to 200 (microprocessors).

This improvement is of immense significance to the hybrid and multichip module industries where each package contains a number of integrated circuit chips. Assuming an optimistic chip yield of 95% after electrical testing and burn-in, for a multichip integrated circuit containing 11 chips, there is only a 57% probability that the multichip integrated circuit will contain no bad chips. Note that for a yield of 85%, the situation is far worse; the probability that a multichip integrated circuit containing 11 dice will be good is only 17%.

Thus, for the optimistic scenario above, 43% of the time it will be necessary to rework the multichip integrated circuit (i.e., open the package, remove the bad chip, attach a new chip, close the package, electrically test and burn in the multichip integrated circuit) at least once prior to placing the multichip integrated circuit into service. Note, too, that more than one rework may be required. Such a process is time consuming and expensive. Further, since it is necessary to electrically test and burn in the multichip integrated circuit as part of each rework, part of the useful life of the good chips is used up during the rework process.

Integrated circuit chips that are electrically tested and burned in according to the invention will rarely fail (i.e., the chip yield after electrical testing and burn-in of an integrated circuit containing the chips is close to 100%). Even assuming a conservative 99% yield, the probability that an 11 chip multichip integrated circuit will be good is 90%. For a 99.5% yield, the probability is 95%. As can be seen, this is a dramatic improvement over the yields that currently exist for multichip integrated circuits.

The method according to the invention eliminates the need for the complex die testing solutions that have been proposed in the past. The method according to the invention may be implemented using existing integrated circuit process flows and equipment. Consequently, since new equipment and new processing procedures are not needed in order to implement the method according to the invention, the method may be implemented at low cost and will avoid the problems that necessarily arise during the implementation of any complex process.

Various embodiments of the invention have been described. The descriptions are intended to be illustrative, not limiting. Thus, it will be apparent to one skilled in the art that certain modifications may be made to the invention as described without departing from the scope of the claims set out below. For instance, if desired, a semiconductor die may be electrically tested and burned in according to the method of the invention any number of times before being committed to a production integrated circuit or sold as an individual die. Further, more than one chip could be tested at a time by a method according to the invention.

We claim:

1. A method for electrically testing and burning in a semiconductor die, comprising the steps of:
   providing capped bond pads on the die;
   providing a package having a die attach area and leads, the leads having inner portions within the package;
   attaching the die to the die attach area;
   attaching bond wires to the capped bond pads and attaching the bond wires to the inner portions of the leads;
   testing the packaged semiconductor die to ascertain acceptable operation;
   disconnecting the bond wires; and
   removing the semiconductor die from the package in such a manner that the semiconductor die is suitable for use in another package if the semiconductor die passed the testing or can be discarded if the semiconductor die did not pass the testing.

2. The method of claim 1, wherein the step of testing comprises:
   electrically testing the semiconductor die;
   burning in the semiconductor die if the semiconductor die operated acceptably during the electrical testing; and
   electrically testing the burned-in semiconductor die.

3. The method of claim 2, wherein: the steps of electrically testing comprise:
   testing the semiconductor die to verify that predetermined speed characteristics are met;
   testing the semiconductor die to verify that predetermined voltage, capacitance and current specifications are met; and
   testing the semiconductor die to verify that the semiconductor die properly performs a predetermined function; and
   the step of burning in comprises elevating the ambient temperature surrounding the package between predetermined first and second temperatures while an electrical load is applied to the semiconductor die.

4. The method of claim 1, wherein the step of attaching bond wires comprises:
   forming a first ribbon bond on each of the selected ones of the bond pads;
   extending ribbon from each of the first ribbon bonds to a location proximate to a predetermined one of the selected ones of the plurality of electrically conductive leads; and
   forming a second ribbon bond on each of the predetermined leads such that the second ribbon bond contacts the ribbon.

5. The method of claim 4, wherein the step of disconnecting comprises tearing each of the ribbons such that the ribbon does not connect the first ribbon bond to the second ribbon bond.

6. The method of claim 4, wherein the step of disconnecting comprises cutting each of the ribbons such that the ribbon does not connect the first ribbon bond to the second ribbon bond.

7. The method of claim 1, wherein the step of disconnecting comprises etching the package with an etchant such that the bond wires are disconnected from the pad cap and at least one layer of pad cap material remains intact over the bond pad.

8. The method of claim 1, wherein the step of disconnecting comprises tearing each of the bond wires such that the bond wire does not connect the capped bond pad to the corresponding lead.

9. The method of claim 1, wherein the step of disconnecting comprises cutting each of the bond wires such that the bond wire does not connect the capped bond pad to the corresponding lead.

10. The method of claim 1, wherein the semiconductor die functions as a microprocessor.

11. The method of claim 1, wherein the semiconductor die functions as a data storage device.

12. A semiconductor die which has been electrically tested and burned in a plurality of times according to the method of claim 1.

13. A method for electrically testing a semiconductor die, the die including a plurality of bond pads for making off-die electrical connection, the method comprising the steps of:

forming an electrically conductive pad cap on each of the plurality of bond pads;

making electrical connection between each of the pad caps and an electronic device used for testing operation of the semiconductor die;

testing the semiconductor die to ascertain acceptable operation; and breaking the electrical connection between each of the pad caps and the electronic device in such a manner that the semiconductor die is suitable for use in another package if the semiconductor die passed the testing.

14. A method as in claim 13, wherein the step of making electrical connection further comprises a step of extending bond wire between each of the pad caps and the electronic device.

15. A method as in claim 14, wherein the step of breaking the electrical connection further comprises the step of tearing the bond wire just above the pad cap such that the bond pad is not damaged.

16. A method as in claim 14, wherein the step of breaking the electrical connection further comprises the step of cutting the bond wire just above the pad cap such that the bond pad is not damaged.

17. A method as in claim 14, wherein the step of extending bond wire further comprises the step of forming a gold ball wire bond between each of the pad caps and the electronic device.

18. A method as in claim 14, wherein the step of extending bond wire further comprises the step of forming a reverse gold ball wire bond between each of the pad caps and the electronic device.

19. A method as in claim 13, wherein each of the pad caps include a layer of gold from which electrical connection is made to the electronic device.

* * * * *